Oct. 1, 1957 W. D. MEEWEZEN 2,808,472

AUDIO FREQUENCY AMPLIFIER WITH VARIABLE FREQUENCY CHARACTERISTIC

Filed July 8, 1954 2 Sheets-Sheet 1

INVENTOR

WILLEM DOUWE MEEWEZEN

BY Theo M Vogel

AGENT

Oct. 1, 1957 W. D. MEEWEZEN 2,808,472

AUDIO FREQUENCY AMPLIFIER WITH VARIABLE FREQUENCY CHARACTERISTIC

Filed July 8, 1954 2 Sheets-Sheet 2

INVENTOR
WILLEM DOUWE MEEWEZEN
BY [signature]
AGENT

United States Patent Office 2,808,472

Patented Oct. 1, 1957

2,808,472

AUDIO FREQUENCY AMPLIFIER WITH VARIABLE FREQUENCY CHARACTERISTIC

Willem Douwe Meewezen, Torrens Park, South Australia, Australia, assignor, by mesne assignments, to North American Philips Company, Inc., New York, N. Y., a corporation of Delaware Application July 8, 1954, Serial No. 442,090

Claims priority, application Australia July 10, 1953

1 Claim. (Cl. 179—171)

This invention relates to frequency-selective audio frequency amplifiers and it is an object thereof to provide such a circuit in which the frequency which suffers least attenuation in the circuit can be varied while maintaining a constant bandwidth or in which the bandwidth can be varied without changing the frequency which suffers least attenuation.

Various circuits are known in which the frequency characteristic of a circuit can be varied by feedback effects, typical circuits of this nature being described in articles by O. G. Villard entitled "Tunable A. F. Amplifier" and "Independent control of selectivity and Bandwidth," published respectively in "Electronics," July 1949, page 77, and "Electronics," April 1951, page 121.

The present invention is based primarily on the recognition that for stability in an amplifier provided with positive feedback the gain through the complete loop circuit of the amplifier should not exceed unity and hence, if the attenuation of the phase shifting networks of circuits similar to those described by Villard can be made small the need for amplification can be minimized and the gain of the amplifiers in the circuit need not greatly exceed unity. Thus, by the use of this invention, the results of circuits as described by Villard can be obtained using fewer valves.

In a circuit arrangement according to the invention two amplifying tubes are connected to form a positive-polarity feedback loop, the electrical couplings between the tubes consisting in two phase shifting networks each comprising a reactance in series with a resistance, each network being connected between the cathode and anode elements of one of the tubes and having the junction between the reactance and the resistance connected to the control grid of the other tube, the phase shifts caused by these two phase shifting networks being in opposite directions while the time constants of the two phase shifting networks differ substantially, each tube being provided with anode and cathode impedances such that the gain of the individual tubes is substantially reduced by negative feedback due to the voltages developed across the related cathode impedances while the total gain around the loop is less than, but near unity, means being provided to vary one of the elements in one of the phase shifting networks to vary the frequency suffering least attenuation without substantially affecting the bandwidth of the circuit and/or means provided for varying the gain around the loop without increasing this gain beyond unity whereby the bandwidth of the circuit may be varied without varying the frequency at which the attenuation of the circuit is a minimum.

Figure 1:
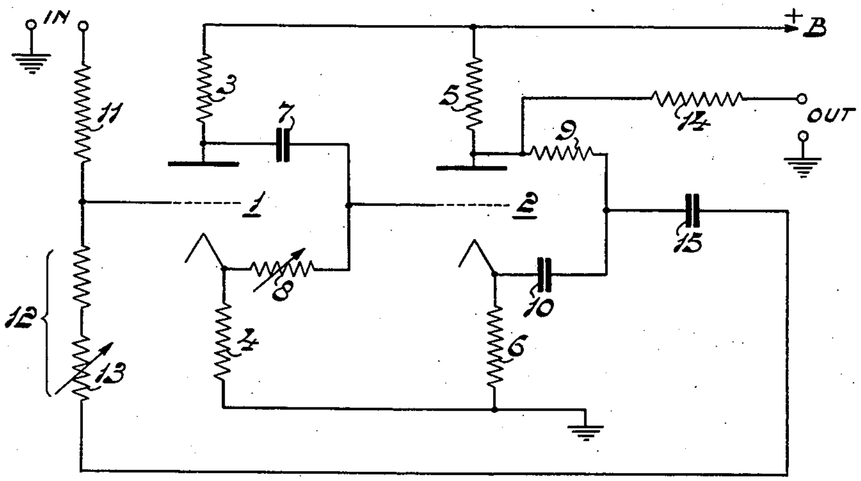

A simple embodiment of the invention is depicted in Fig. 1 wherein numerals 1 and 2 denote triode valves. Resistances 3 and 4 are connected in the anode and cathode circuits of valve 1 and resistors 5 and 6 are similarly connected in the anode and cathode circuits of valve 2. A condenser 7 and a variable resistance 8 are connected in series between the anode and cathode of valve 1 the junction of the condenser 7 and resistor 8 being connected to the control grid of valve 2, the other electrode of condenser 7 being connected to the anode of the valve 1.

Resistance 9 and condenser 10 are connected in series across the anode and cathode of tube 2, the resistance 9 being connected to the anode and the junction between the resistance 9 and condenser 10 is connected to the control grid of tube 1 via resistance 12 and blocking condenser 15. The networks formed by resistor 7 condenser 8 and resistor 9 condenser 10 are phase shift networks causing phase shifts dependent upon frequency in opposite directions, the overall phase shift being such as to provide positive feedback at a desired frequency or over a desired bandwidth or range of frequencies.

The resistor 12 which comprises a fixed resistance and an adjustable resistance 13 is for the purpose of isolating the phase shift network 9, 10 from the input of the circuit, another resistance 11 being connected between the input terminal and the control grid of valve 1 for the same purpose. The output terminal is fed from the anode of valve 2 via an output isolation resistance 14. In this circuit, that frequency at which the phase shift is zero around the circuit loop, thereby providing positive feedback at this frequency, may be varied by varying one of the elements in the phase shift circuits, for example the resistance 8, this being indicated as variable in the figure by means of an arrow, and at this frequency, for the circuit to be stable and free from self oscillation the gain around the circuit loop must be less than unity. On the other hand, as a result of the positive feedback, if this loop gain is close to unity then the gain of the circuit from the control grid of valve 1 to the output of valve 2 will be enhanced and very large for that frequency at which the loop phase shift is zero while the gain for other frequencies will not be increased to the same degree. Hence for loop gains close to unity the circuit functions as a frequency selective amplifier of narrow bandwidth. If the loop gain is decreased the enhancement of the gain for the frequency at which the phase shift through the loop is zero will be reduced and the circuit will function as a frequency selective circuit of wider bandwidth.

The loop gain of the circuit of Figure 1 depends upon both the gains due to the tubes and the attenuations due to the other elements of the circuit. Of these factors the gains due to the tubes are likely to be the least stable.

According to the invention the gains of the individual tubes 1 and 2 are stabilised by negative feedback due to voltages generated across resistors 4 and 6 respectively. It is well known that the greater the reduction in gain by negative feedback the greater the stability of the effective gain of the tube. Effective gain required from the tubes to result in a loop gain close to unity will decrease as the attenuation due to the phase shifting networks decreases. Hence it is desirable that the losses in the phase shifting networks should be a minimum. In addition, if the centre frequency at which the gain of the circuit is enhanced is to be variable over a given range of frequencies then the loop gain must be stabilised at a substantially constant value over this same range of frequencies despite variations in one of the elements of one of the phase shifting networks.

It is well known that the attenuation of phase shifting circuits such as those formed by reactances and resistors 7 and 8 or 10 and 9 is constant over a wide range of frequencies provided that the phase shifting network output feeds into a very high impedance to ground while the network is fed from a low impedance source with voltages balanced with respect to ground.

The circuits shown in Fig. 1 associated with the valves 1 and 2 would closely approximate such an arrangement if the anode and cathode resistances of each tube had equal values. However such values would be useless for the purposes of the invention as the gain of the valves would be slightly less than unity under such conditions. For the purposes of the invention it is necessary to reduce the values of the cathode resistors as compared with the values of the anode resistances until the effective gains of the valves are increased to greater than unity in order to offset the attenuations of other elements in the circuit and to provide an overall loop gain of less than, but close to unity.

This increase in tube gain due to reduction in the cathode resistance causes the phase shifting networks 7, 8 and 9, 10 to be fed with voltages which are not balanced with respect to ground with the result that the attenuation of the phase shifting networks is no longer independent of frequency. However in a circuit according to the invention the output voltage versus frequency characteristic curves of the two phase shifting networks will slope in opposite directions and will therefore tend to maintain an overall attenuation which is substantially independent of frequency. If necessary the gains of the amplifier tubes may also be caused to vary with frequency by shunting the cathode resistors with suitable reactances in order to level off the loop gain versus frequency characteristic curve of the circuit as a whole.

It is also mentioned that the series impedance of the phase shifting networks should be large in comparison with the anode resistances 3 and 5 respectively as otherwise the gains of the tubes will fall with frequency increase.

In a circuit according to the invention as depicted in Figure 1 the frequency at which the gain of the circuit from input to output is a maximum may be varied by varying an element in one of the phase shifting networks such as resistance 8 without danger of self oscillation or change in the bandwidth of the circuit because the loop gain remains substantially constant. On the other hand the bandwidth of the circuit may be changed without varying the frequency at which gain is a maximum by reducing the loop gain. In Figure 1 the portion of the isolating resistance 12 marked 13 is indicated as variable by an arrow and may be varied to reduce the loop gain and thus control the bandwidth, it being necessary of course to ensure that the loop gain when this resistor 13 is set at its minimum value is less than although close to unity.

The attenuation versus frequency characteristic of a circuit such as that shown in Figure 1 generally resembles the corresponding curve for a tuned circuit, the attenuation of the circuit being a minimum for some particular frequency and increasing for frequencies higher or lower than this frequency. In practical use of such a circuit it is an additional convenience that the circuit can be easily modified so as to provide a circuit in which the attenuation increases or decreases with frequency.

Figure 2:
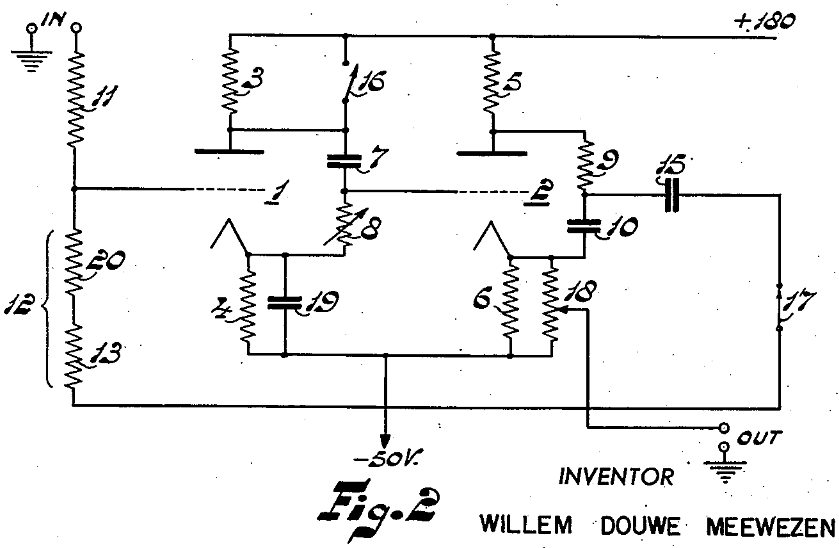

Figure 2 depicts a practical embodiment of the invention the components being denoted by numerals similar to those used in Figure 1.

In this circuit the component values were as hereunder:

| | |
|---|---|
| 3 | 15,000 ohms. |
| 4 | 14,500 ohms. |
| 5 | 25,000 ohms. |
| 6 | 24,500 ohms. |
| 7 | 5,000 pf. |
| 8 | 250,000 ohms. |
| 9 | 100,000 ohms. |
| 10 | 5,000 pf. |
| 11 | 1,000,000 ohms. |
| 13 | 250,000 ohms. |
| 15 | 5,000 pf. |
| 18 | 250,000 ohms. |
| 19 | 750 pf. |
| 20 | 50,000 ohms. |

This circuit differs from that of Figure 1 in that the output is taken from a voltage divider 18 connected across resistance 6 instead of from the anode of valve 2, the resistor 4 is shunted by a small capacity 19 to increase the gain of valve 1 at higher frequencies, and the switches 16 and 17 convert the attenuation versus frequency characteristic of the circuit from that resembling a tuned circuit (when these switches are in a first position) to that of a circuit wherein attenuation increases with frequency (when these switches are in a second position), the attenuation being controlled by resistor 8. In making the conversion from the first position to the second position of the switches 16 and 17, switch 16 is closed thus connecting the anode of valve 1 to a point of constant potential while switch 17 is opened thus breaking the feedback loop of the circuit. Under these conditions valves 1 and 2 function as cathode followers separated by a resistance capacity filter formed by condenser 7 and resistor 8 which causes a controllable increase in attenuation with increase in frequency. The phase shifting network formed by resistor 9 and condenser 10 is ineffective and the gain of the whole circuit is a little less than unity.

Figure 3:
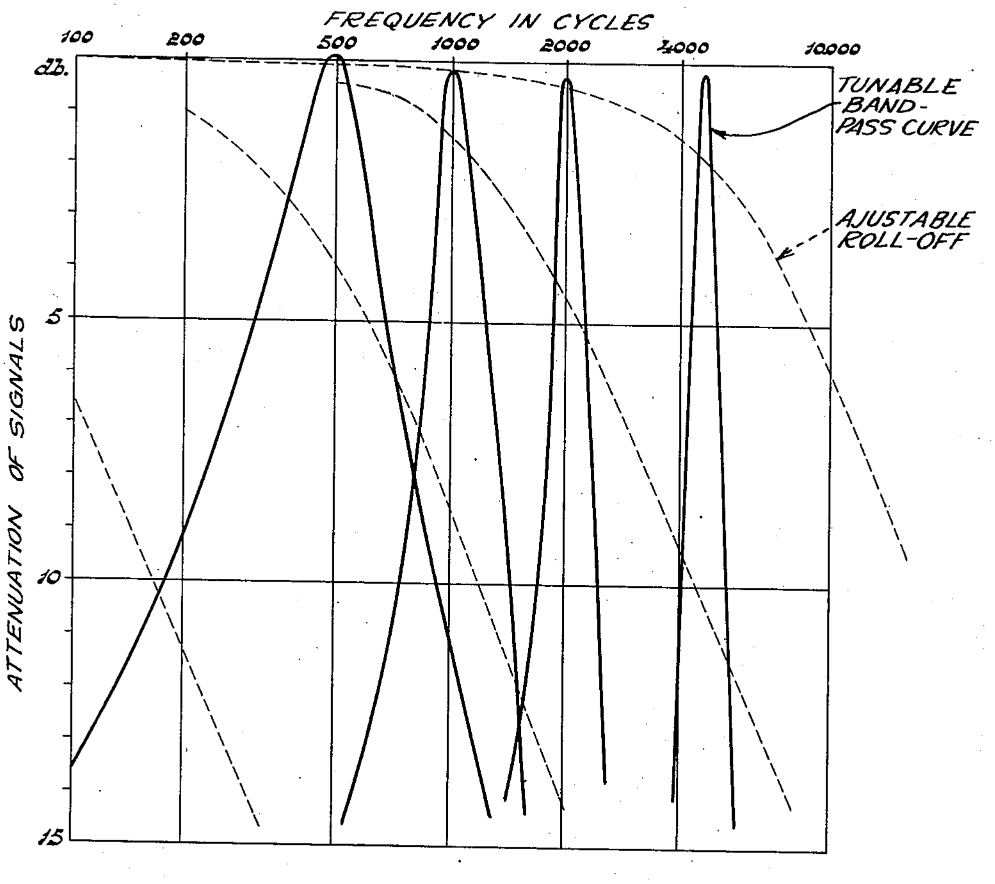

Gain versus frequency curves are shown for this circuit in Figure 3, where the solid curves show the sharply tuned characteristics obtainable at several different frequencies when the switches 16, 17 are in their first position, and the dashed curves show various high-frequency roll-off characteristics obtainable when the switches 16, 17 are in their second position.

What is claimed is:

A positive feedback amplifier circuit, comprising first and second amplifying tubes each having a cathode, an anode and a grid, a source of input signals connected to the grid of said first tube, an anode resistor connected at an end thereof to the anode of said first tube, a cathode resistor connected at an end thereof to the cathode of said first tube, a source of operating voltage connected to the remaining ends of said resistors, said resistors being unbypassed so that said signals appear at both the anode and cathode of said first tube, a phase-shifting network comprising a resistance and a reactance connected in series with a given order directly between the cathode and anode of said first tube, signal-conductive means connecting the junction of said resistance and reactance to the grid of said second tube, an anode resistor connected at an end thereof to the anode of said second tube, a cathode resistor connected at an end thereof to the cathode of said second tube, a source of operating voltage connected to the remaining ends of the last-named resistors, said last-named resistors being unbypassed so that said signals appear at both the anode and cathode of said second tube, a phase-shifting network comprising a resistance and a reactance connected in series with the reverse order of said given order directly between the cathode and anode of said second tube, and signal-conductive means connecting the junction of the last-named resistance and reactance to the grid of said first tube thereby forming a positive feedback loop, said phase-shifting networks having substantially different time constants, and said cathode resistors having sufficiently high values of resistance to provide a sufficiently high degree of negative feedback for each of said tubes to reduce the gain around said positive feedback loop to a value slightly less than unity.

References Cited in the file of this patent

UNITED STATES PATENTS

| | | |
|---|---|---|
| 2,000,505 | Black | May 7, 1935 |
| 2,178,072 | Fritzinger | Oct. 31, 1939 |
| 2,186,571 | Beale | Jan. 9, 1940 |
| 2,210,997 | Anderson | Aug. 13, 1940 |
| 2,264,715 | Rohr et al. | Dec. 2, 1941 |
| 2,383,867 | Koch | Aug. 28, 1945 |

FOREIGN PATENTS

| | | |
|---|---|---|
| 516,358 | Great Britain | Jan. 1, 1939 |
| 668,232 | Great Britain | Mar. 12, 1952 |